(12) United States Patent
Hirose

(10) Patent No.: US 6,448,833 B2
(45) Date of Patent: Sep. 10, 2002

(54) DELAY CIRCUIT

(75) Inventor: Yukitoshi Hirose, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/800,025

(22) Filed: Mar. 6, 2001

(30) Foreign Application Priority Data

Mar. 8, 2000 (JP) ........................................ 2000-062998

(51) Int. Cl.[7] .............................................. H03H 11/26
(52) U.S. Cl. ........................ 327/284; 327/285; 327/271; 327/398
(58) Field of Search ................................ 327/284, 285, 327/271, 277, 261, 288, 392, 393, 394, 395, 398, 399, 400, 401

(56) References Cited

U.S. PATENT DOCUMENTS

| | | | | |
|---|---|---|---|---|
| 5,097,159 A | * | 3/1992 | Seki et al. | 327/263 |
| 5,598,111 A | * | 1/1997 | Enomoto | 326/83 |
| 5,801,567 A | * | 9/1998 | Kosiec | 327/263 |
| 5,801,568 A | * | 9/1998 | Young | 327/284 |
| 5,801,576 A | * | 9/1998 | Ooishi | 327/530 |
| 5,914,516 A | * | 6/1999 | Konno | 257/357 |
| 6,121,813 A | * | 9/2000 | Furuchi | 327/285 |
| 6,278,310 B1 | * | 8/2001 | Stave | 327/264 |

FOREIGN PATENT DOCUMENTS

| | | |
|---|---|---|
| JP | 6-61810 | 3/1994 |
| JP | 7-154964 | 6/1995 |

* cited by examiner

Primary Examiner—Timothy P. Callahan
Assistant Examiner—Hai L. Nguyen
(74) Attorney, Agent, or Firm—Dickstein Shapiro Morin & Oshinsky LLP

(57) ABSTRACT

A delay circuit using MOS transistors for use of load capacitance which produces a stable delay effect for variations in signal voltage is provided. A gate of a P-type MOS transistor for load capacitance and a gate of an N-type MOS transistor for load capacitance are connected to a signal line. A resistor and CMOS inverters are used to apply a boosted voltage higher than a supply voltage $V_{DD}$ to a source-drain of the P-type MOS transistor for load capacitance and a substrate voltage lower than a ground voltage to a source-drain of the N-type MOS transistor for load capacitance. As a result, a gate voltage range for allowing the MOS transistors for load capacitance to have a capacitance is extended, and a stable delay effect is assured for a widened variation of signal current flowing on the signal line.

7 Claims, 4 Drawing Sheets

DELAY CIRCUIT

BACKGROUND OF THE INVENTION

1. Field of the Invention

The present invention relates to a delay circuit using MOS capacitors, and more particularly to a delay circuit formed within a semiconductor integrated circuit and capable of obtaining a stable delay effect even when signal voltage varies.

2. Description of the Related Art

Conventionally, when clock centering adjustment or signal timing adjustment is performed in a wafer test step or a test step after assembly for a semiconductor integrated circuit, a MOS transistor for load capacitance is mainly used as a delay circuit. For example, a circuit used as the delay circuit is formed such that gates of a P-type MOS transistor for load capacitance and an N-type MOS transistor for load capacitance are connected to a clock line or a signal line, supply voltage $V_{DD}$ is applied to a terminal at which a source and a drain are joined together (hereinafter referred to as "source-drain") of the P-type MOS transistor for load capacitance and ground voltage $V_{GND}$ is applied to a source-drain of the N-type MOS transistor for load capacitance. When a signal with an appropriate voltage is input to the signal line of this circuit, the MOS transistors act as capacitors which cause the signal current to be charged in the MOS transistors for load capacitance and thus to be outputted with a certain delay after the input.

FIG. 1 shows an example of a conventional delay circuit. Signal line 10 is connected to a gate of P-type MOS transistor 3 for load capacitance and to a gate of N-type MOS transistor 4 for load capacitance. Source-drains of these MOS transistors 3 and 4 are connected to output terminals of CMOS inverters 5 and 6, respectively. In each of CMOS inverters 5 and 6, supply voltage $V_{DD}$ is applied to a source of a P-type MOS transistor, while ground voltage $V_{GND}$ is applied to a drain of an N-type MOS transistor. Fuse or resistor 8 is connected to an input terminal of CMOS inverter 5. Output terminal of inverter 7 is connected to input terminal of CMOS inverter 6, while input terminal of inverter 7 is connected to a fuse or resistor 8.

In the aforementioned circuit, switching of the fuse or resistor 8 enables selection of voltages applied to the source-drains of MOS transistors 3 and 4 for load capacitance through inverters 5 and 6. When certain voltages are applied to the source-drains of MOS transistors 3 and 4 for load capacitance, MOS transistors 3 and 4 for load capacitance act as capacitances in accordance with the voltage of a signal on signal line 10 to produce a delay effect for the signal.

The aforementioned delay circuit, however, has a problem of a narrow range of signal voltages in which stable load capacitances can be obtained. Such a tendency is significant especially when the supply voltage is low. More detailed description is hereinafter made with reference to FIG. 1. When fuse or resistor 8 is at a low level, the voltage at the input terminal of inverter 5 is at a low level, the P-type MOS transistor in inverter 5 is turned ON, and the N-type MOS transistor is turned OFF. Thus, the voltage at the source-drain of P-type MOS transistor 3 for load capacitance is at $V_{DD}$. Since a signal through fuse or resistor 8 is reversed at inverter 7, a signal at a high level is input to the input terminal of inverter 6. Therefore, the P-type MOS transistor in inverter 6 is turned OFF and the N-type MOS transistor is turned ON, and thus the voltage at the source-drain of N-type MOS transistor 4 for load capacitance is at $V_{GND}$.

When a threshold voltage of the P-type MOS transistor is $V_{tp}$ and a threshold voltage of the N-type MOS transistor is $V_{tn}$, a gate voltage for allowing P-type MOS transistor 3 for load capacitance to have a load capacitance is equal to or lower than the voltage represented by $V_{DD}-V_{tp}$, while a gate voltage for allowing N-type MOS transistor 4 for load capacitance to have a load capacitance is equal to or higher than the voltage represented by $V_{GND}+V_{tn}$.

FIG. 2 shows ranges of gate voltages allowing to have load capacitances: range 23 for allowing P-type MOS transistor 3 for load capacitance, range 21 for N-type MOS transistor for load capacitance and range 22 effective for both P-type MOS transistor 3 and N-type MOS transistor 4 for load capacitance. Gate voltages range 22 in which both P-type MOS transistor 3 for load capacitance and N-type MOS transistor 4 for load capacitance have a load capacitance is from $V_{GND}+V_{tn}$ to $V_{DD}-V_{tp}$. The range is narrower than the range of signal voltages when the latter extends from $V_{GND}$ to $V_{DD}$. For this reason, a change in signal voltage may cause the inability to obtain a stable load capacitance value, leading to an unstable delay effect. Particularly, when the difference between the supply voltage and the ground voltage is smaller, the range of gate voltages in which both P-type MOS transistor 3 for load capacitance and N-type MOS transistor 4 for load capacitance have a load capacitance is further narrowed to present a more unstable delay effect.

SUMMARY OF THE INVENTION

The present invention has been made in view of such a problem, and it is an object thereof to provide a delay circuit which produces a stable delay effect even with changes in signal voltage.

A delay circuit according to a first aspect of the present invention comprises a P-type MOS transistor for load capacitance whose gate is connected to a signal line and source and drain are connected to each other to make a source-drain, an N-type MOS transistor for load capacitance whose gate is connected to the signal line and source and drain are connected to each other to make a source-drain, first power supply means for applying a boosted voltage higher than supply voltage $V_{DD}$ to a source-drain of the P-type MOS transistor for load capacitance, and second power supply means for applying a substrate voltage lower than ground voltage $V_{GND}$ to a source-drain of the N-type MOS transistor for load capacitance.

In this case, it is preferable that the delay circuit further comprises means for switching between the boosted voltage higher than supply voltage $V_{DD}$ and a voltage equal to or lower than ground voltage $V_{GND}$ as a voltage applied by the first power supply means to the source-drain of the P-type MOS transistor for load capacitance, and means for switching between a voltage equal to or higher than supply voltage $V_{DD}$ and the substrate voltage lower than ground voltage $V_{GND}$ as a voltage applied by the second power supply means to the source-drain of the N-type MOS transistor for load capacitance.

A delay circuit according to a second aspect of the present invention comprises a P-type MOS transistor for load capacitance whose gate is connected to a signal line and source and drain are connected to each other to make a source-drain, an N-type MOS transistor for load capacitance whose gate is connected to the signal line and source and drain are connected to each other to make a source-drain, a first CMOS inverter having an output terminal connected to a source-drain of the P-type MOS transistor for load capacitance, first power supply means for applying a boosted voltage higher than supply voltage $V_{DD}$ to a higher potential side of the first CMOS inverter and for applying a voltage equal to or lower than ground voltage $V_{GND}$ to a lower potential side of the first CMOS inverter, a second CMOS inverter having an output terminal connected to a source-drain of the N-type MOS transistor for load capacitance, second power supply means for applying a voltage equal to or higher than supply voltage $V_{DD}$ to a higher potential side of the second CMOS inverter and for applying a substrate voltage lower than ground voltage $V_{GND}$ to a lower potential side of the second CMOS inverter, and switching means for applying a voltage for controlling the operations of the first and second CMOS inverters to the first and second CMOS inverters to switch between the voltage on the higher potential side and the voltage on the lower potential side as outputs from the first and second CMOS inverters.

The switching means preferably includes an inverter having an output terminal connected to an input terminal of one of the first and second CMOS inverters and applies a potential with a phase reversed of the other CMOS inverters.

In addition, the switching means may employ the inverter and a fuse, or the inverter and a resistor.

DETAILED DESCRIPTION OF THE PREFERRED EMBODIMENT

Figure 3:
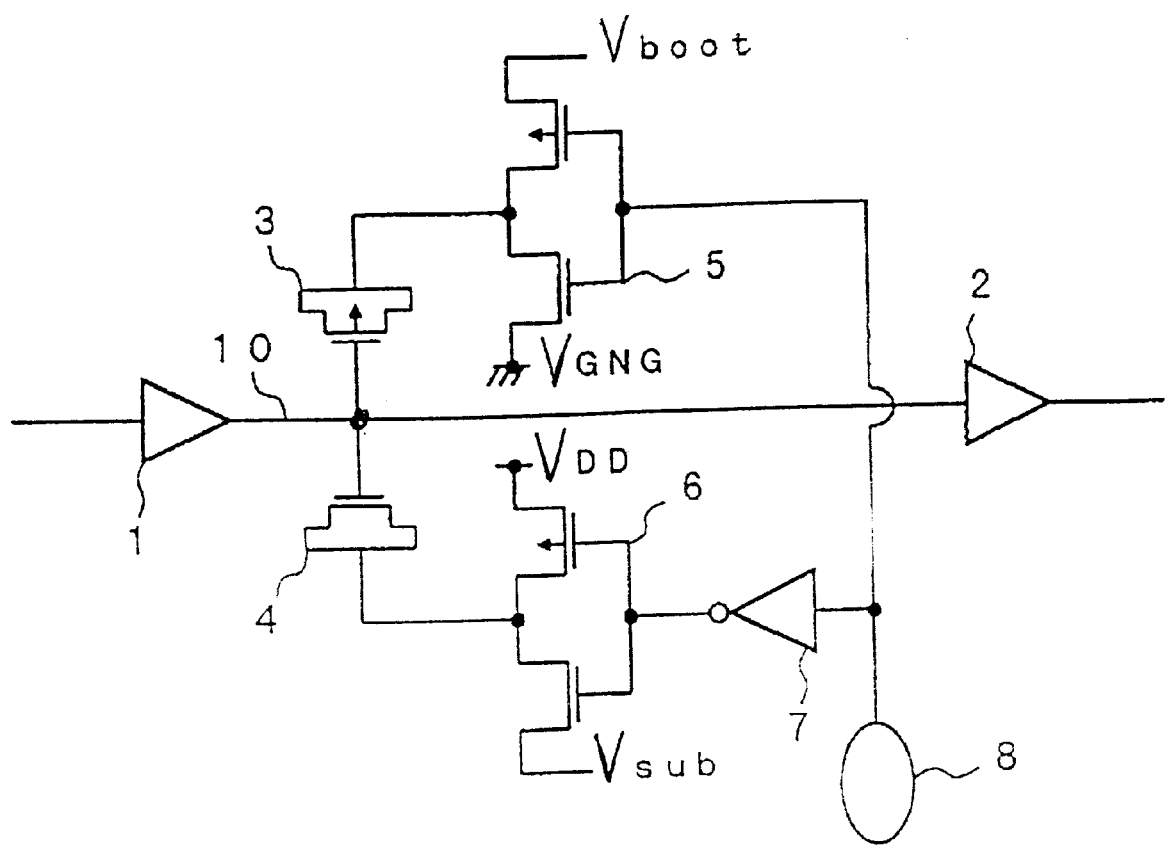
FIG. 3 is a schematic diagram showing a delay circuit in an embodiment of the present invention.

An embodiment of the present invention is hereinafter described specifically with reference to the accompanying drawings. FIG. 3 shows a configuration of the embodiment of the present invention. Buffer 1 and buffer 2 for driving a signal current are disposed on the input side and the output side of signal line 10. A gate of P-type MOS transistor 3 for load capacitance and a gate of N-type MOS transistor 4 for load capacitance are connected between buffer 1 and buffer 2. A source-drain of P-type MOS transistor 3 for load capacitance is connected to CMOS inverter 5. Boosted voltage $V_{boot}$ higher than supply voltage $V_{DD}$ is applied to a source of a P-type MOS transistor of CMOS inverter 5, while ground voltage $V_{GND}$ is applied to a drain of an N-type MOS transistor thereof. A source-drain of N-type MOS transistor 4 for load capacitance is connected to CMOS inverter 6. Supply voltage $V_{DD}$ is applied to a source of a P-type MOS transistor of CMOS inverter 6, while substrate voltage $V_{sub}$ lower than ground voltage $V_{GND}$ is applied to a drain of an N-type MOS transistor thereof. An input terminal of COMS inverter 5 is connected to resistor 8, and an input terminal of CMOS inverter 6 is connected to resistor 8 through inverter 7.

Next, the operation of the embodiment is described. Resistor 8 serving as means for switching a load capacitance selecting potential sets a load capacitance selecting potential at a low level. At this point, the input voltage to CMOS inverter 5 is at a low level, the P-type MOS transistor in CMOS inverter 5 is turned ON, and the N-type MOS transistor is turned OFF. Thus, the voltage at the source-drain of P-type MOS transistor 3 for load capacitance is at $V_{boot}$. Since a signal through resistor 8 is reversed at inverter 7, a signal at a high level is inputted to the input terminal of inverter 6. Therefore, since the P-type MOS transistor in inverter 6 is turned OFF and the N-type MOS transistor is turned ON, the voltage at the source-drain of N-type MOS transistor 4 for load capacitance is at $V_{sub}$.

In this case, a gate voltage range for allowing P-type MOS transistor 3 for load capacitance to have a load capacitance includes voltages equal to or lower than the voltage represented by $V_{boot}-V_{tp}$, while a gate voltage range for allowing N-type MOS transistor 4 for load capacitance to have a load capacitance includes voltages equal to or higher than the voltage represented by $V_{sub}+V_{tn}$. Thus, when the load capacitance selecting potential is at the low level, both P-type MOS transistor 3 for load capacitance and N-type MOS transistor 4 for load capacitance have load capacitances to act as capacitors if signal voltages range from $V_{sub}+V_{tn}$ to $V_{boot}-V_{tp}$.

Next, description is made for the operation when resistor 8 sets the load capacitance selecting potential at a high level. In this case, the input voltage to CMOS inverter 5 is at a high level, the P-type MOS transistor in CMOS inverter 5 is turned OFF, and the N-type MOS transistor is turned ON. Thus, the voltage at the source-drain of P-type MOS transistor 3 for load capacitance is at $V_{GND}$. A signal through resistor 8 is reversed at inverter 7, and a signal at a low level is input to the input terminal of CMOS inverter 6. Therefore, since the P-type MOS transistor in CMOS inverter 6 is turned ON and the N-type MOS transistor is turned OFF, the voltage at the source-drain of N-type MOS transistor 4 for load capacitance is at $V_{DD}$.

In this case, a gate voltage range for allowing P-type MOS transistor 3 for load capacitance to have a load capacitance includes voltages equal to or lower than the voltage represented by $V_{GND}-V_{tp}$, while a gate voltage range for allowing N-type MOS transistor 4 for load capacitance to have a load capacitance includes voltages equal to or higher than the voltage represented by $V_{DD}+V_{tn}$. Thus, when the load capacitance selecting potential is at the high level, none of P-type MOS transistor 3 for load capacitance and N-type MOS transistor 4 for load capacitance have load capacitances if signal voltages range from $V_{GND}$ to $V_{DD}$, thereby presenting no delay effect for signals.

Figure 1:
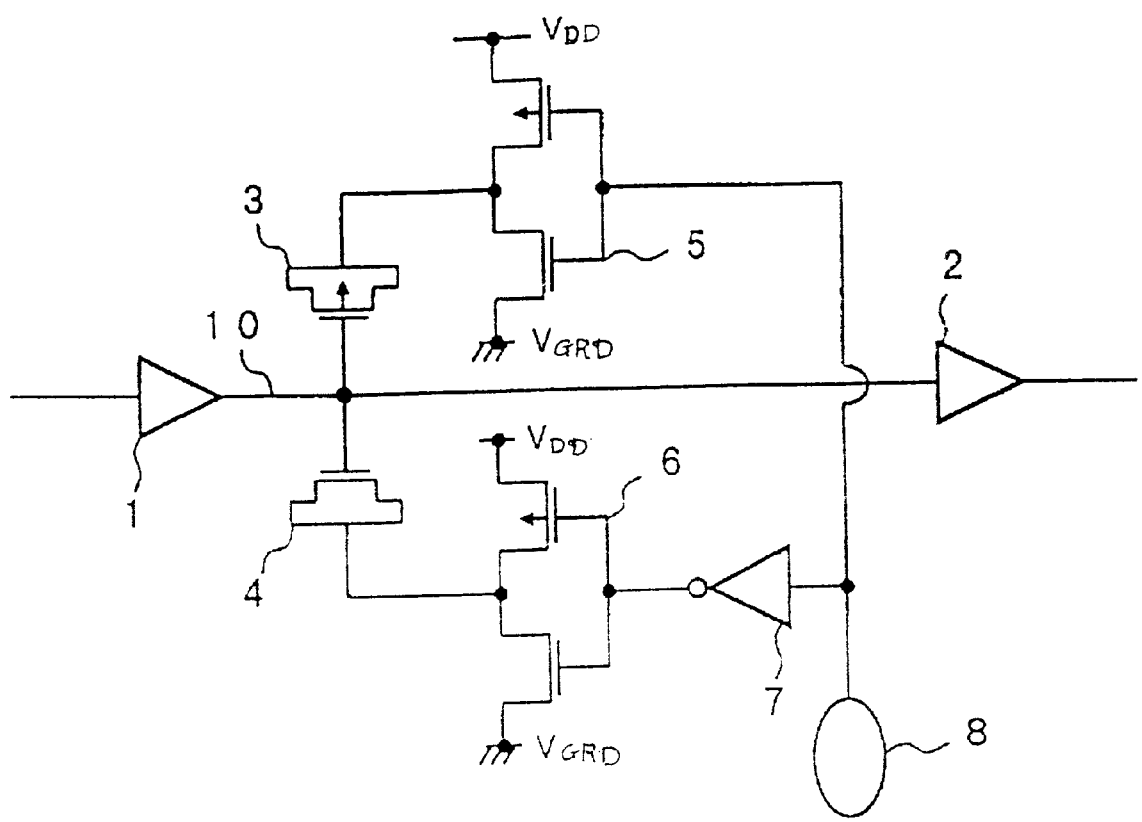
FIG. 1 is a schematic diagram showing a conventional delay circuit.
Figure 2:
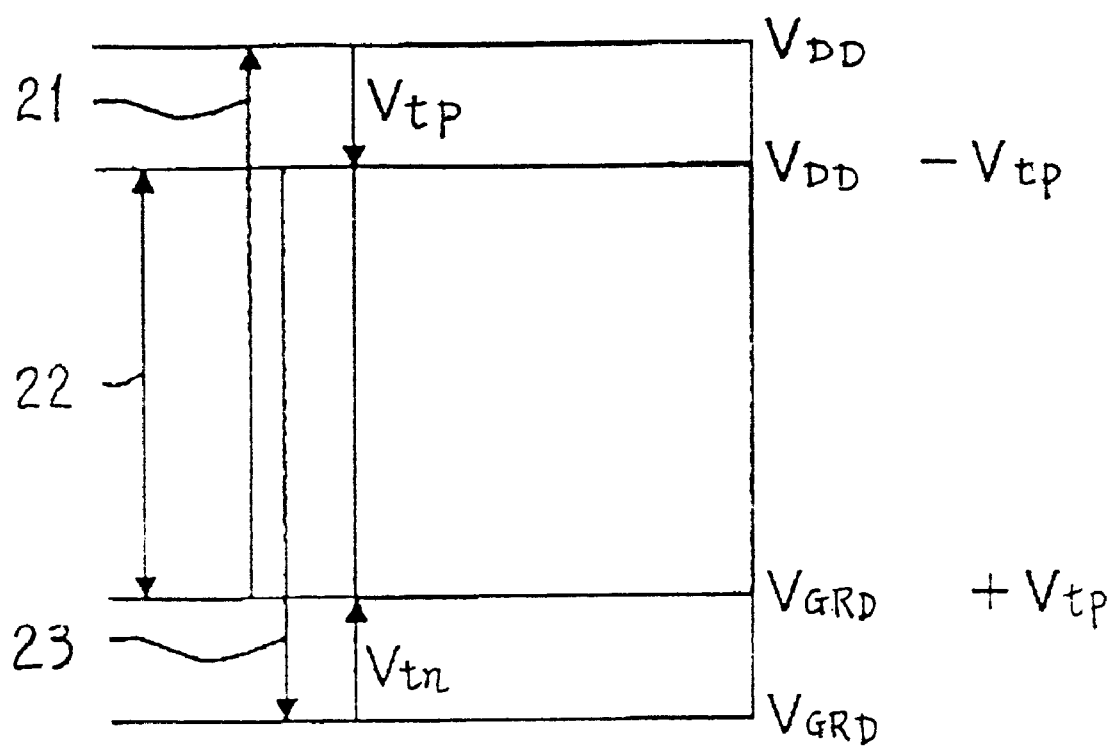
FIG. 2 is a diagram showing a gate voltage range in which MOS transistors for load capacitance have a capacitance to act as a capasitor in the conventional delay circuit.
Figure 4:
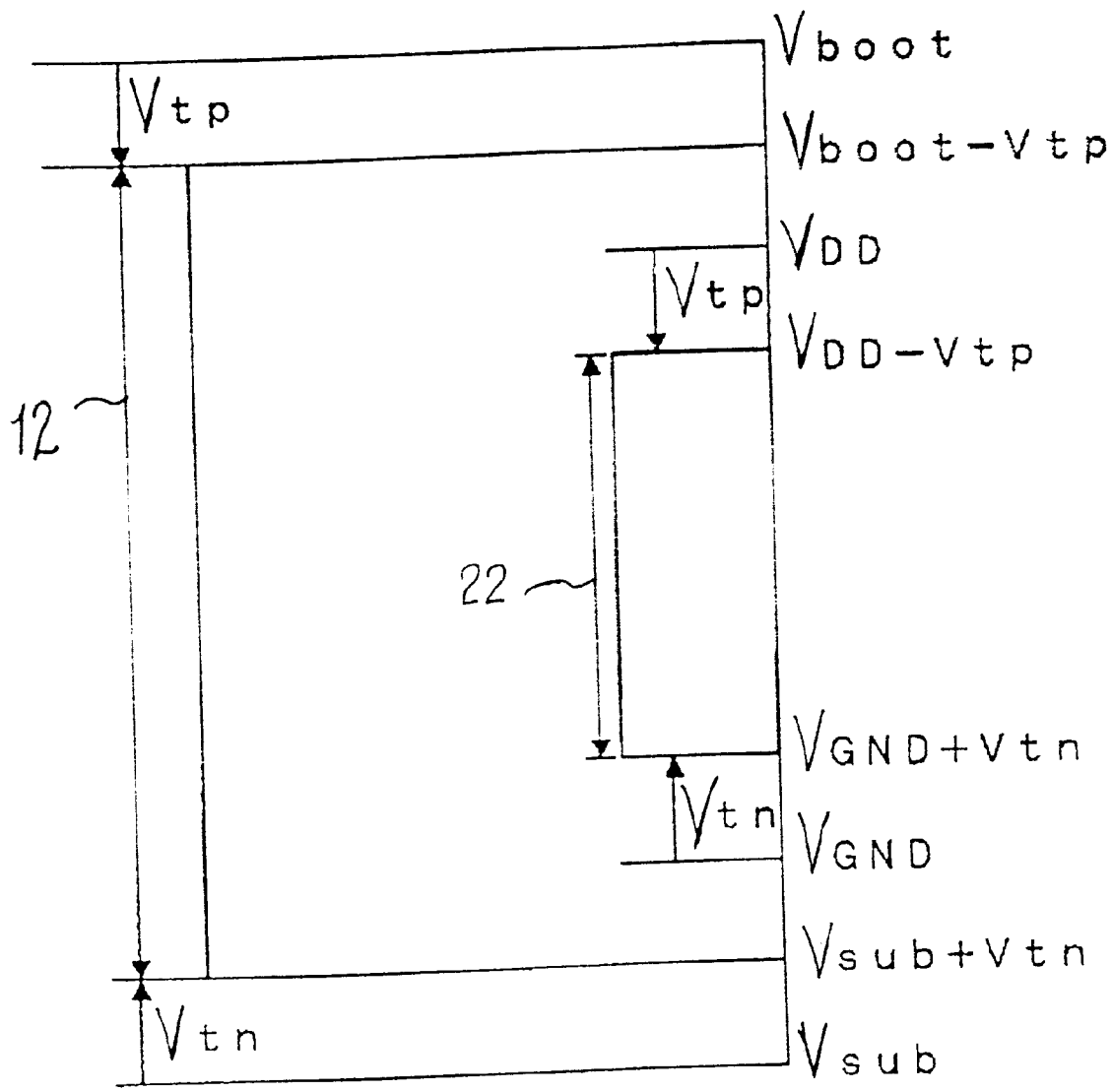
FIG. 4 is a diagram showing a gate voltage range in which MOS transistors for load capacitance have a capacitance to act as a capacitor in the delay circuit of the embodiment.

Next, the effects of the embodiment are described. FIG. 4 shows a signal voltage range 12 effective for allowing both P-type MOS transistor 3 for load capacitance and N-type MOS transistor 4 for load capacitance to have load capacitances in the embodiment, comparing with range 22 in the prior art shown in FIG. 2. When the load capacitance selecting potential is at the low level, the range of signal voltages for allowing both P-type MOS transistor 3 for load capacitance and N-type MOS transistor 4 for load capacitance to have capacitances r is from $V_{sub}+V_{tn}$ to $V_{boot}-V_{tp}$, which is wider than the signal voltage range in the prior art by the voltage value represented by $V_{boot}-V_{DD}+V_{GND}-V_{sub}$. Thus, the embodiment can produce a more stable delay effect for changes in signal voltage than the prior art.

The aforementioned embodiment provides an example in which inverter 7 is disposed between CMOS inverter 6 and resistor 8 such that P-type MOS transistor 3 for load capacitance and N-type MOS transistor 4 for load capacitance have load capacitances when the load capacitance selecting potential is at the low level. The present invention, however, also includes a delay circuit in which inverter 7 is disposed between CMOS inverter 5 and resistor 8 such that P-type MOS transistor 3 for load capacitance and N-type MOS transistor 4 for load capacitance have load capacitances when the load capacitance selecting potential is at the high level.

While the embodiment employs a resistor as means for switching a load capacitance selecting potential, a fuse may be used. Another means which can switch voltages applied to the input terminals of CMOS inverters 5 and 6 may be used. When a resistor is used, a certain voltage is applied to the input side of the resistor to change the resistance value of the resistor, thereby selecting potentials applied to the input terminals of CMOS inverters 5 and 6. Alternatively, when a fuse is used, a high potential voltage and a low potential voltage are applied to the input sides of two fuses, respectively, and the fuses are switched to select potentials applied to the input terminals of CMOS inverters 5 and 6.

The aforementioned embodiment provides an example in which one P-type MOS transistor for load capacitance and one N-type MOS transistor for load capacitance are used. The present invention, however, also includes a delay circuit in which a plurality of one or both of two types of transistors are used.

In addition, the present invention includes a delay circuit in which the gate structure of a transistor for load capacitance comprises a control gate and a floating gate as in a memory cell of a flash memory, and electrons are injected into or drawn from the floating gate to change a threshold voltage of the MOS transistor for load capacitance, thereby controlling a gate voltage range for allowing the MOS transistor for load capacitance to have a load capacitance.

The present invention also includes a delay circuit in which ions are implanted into a MOS transistor for load capacitance to change a threshold voltage of the MOS transistor for load capacitance, thereby controlling a gate voltage range for allowing the MOS transistor for load capacitance to have a load capacitance.

What is claimed is:

1. A delay circuit comprising:
   a P-type MOS transistor for load capacitance whose gate electrode is connected to a signal line and source and drain electrodes are connected to each other;
   an N-type MOS transistor for load capacitance whose gate electrode is connected to said signal line and source and drain electrodes are connected to each other;
   first power supply means for applying a boosted voltage higher than a supply voltage $V_{DD}$ to the connection of source and drain of said P-type MOS transistor for load capacitance;
   second power supply means for applying a substrate voltage lower than a ground voltage to the connection of source and drain of said N-type MOS transistor for load capacitance;
   means for switching between said boosted voltage higher than said supply voltage $V_{DD}$ and a voltage equal to or lower than said ground voltage as a voltage applied by said first power supply means to said connection of source and drain of said P-type MOS transistor for load capacitance; and
   means for switching between a voltage equal to or higher than said supply voltage $V_{DD}$ and said substrate voltage lower than said ground voltage as a voltage applied by said second power supply means to said connection of source and drain of said N-type MOS transistor for load capacitance.

2. A delay circuit comprising:
   a P-type MOS transistor for load capacitance whose gate is connected to a signal line and source and drain are connected to each other;
   an N-type MOS transistor for load capacitance whose gate is connected to said signal line and source and drain are connected to each other;
   a first CMOS inverter whose output terminal is connected to the connection of source and drain of said P-type MOS transistor for load capacitance;
   first power supply means for applying a voltage higher than a supply voltage $V_{DD}$ to a higher potential side of said first CMOS inverter and for applying a voltage equal to or lower than a ground voltage to a lower potential side of said first CMOS inverter;
   a second CMOS inverter whose output terminal connected to the connection of source and drain of said N-type MOS transistor for load capacitance;
   second power supply means for applying a voltage equal to or higher than said supply voltage to a higher potential side of said second CMOS inverter and for applying a substrate voltage lower than said ground voltage to a lower potential side of said second CMOS inverter; and
   switching means for applying a voltage for controlling the operations of said first and second CMOS inverters to said first and second CMOS inverters to switch between the voltage on the higher potential side and the voltage on the lower potential side as outputs from said first and second CMOS inverters.

3. The delay circuit according to claim 2, wherein said switching means comprise said inverter and a plurality of fuses.

4. The delay circuit according to claim 2, wherein said switching means includes an inverter having an output terminal connected to an input terminal of one of said first and second CMOS inverters and applies a potential with a phase reversed of the other CMOS inverter.

5. The delay circuit according to claim 4, wherein said switching means employs said inverter and a resistor.

6. The delay circuit according to claim 4, wherein said switching means comprises said inverter and a plurality of fuses.

7. The delay circuit according to claim 2, wherein said switching means employs said inverter and a resistor.

* * * * *